United States Patent
Min et al.

(10) Patent No.: US 8,039,372 B2
(45) Date of Patent: Oct. 18, 2011

(54) METHODS OF MANUFACTURING VARIABLE RESISTANCE NON-VOLATILE MEMORY DEVICES INCLUDING A UNIFORMLY NARROW CONTACT LAYER

(75) Inventors: Chung-Ki Min, Yongin-si (KR); Tae-Eun Kim, Suwon-si (KR); Byoung-Moon Yoon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 1116 days.

(21) Appl. No.: 11/829,556

(22) Filed: Jul. 27, 2007

(65) Prior Publication Data

US 2008/0029754 A1 Feb. 7, 2008

(30) Foreign Application Priority Data

Aug. 1, 2006 (KR) .................. 10-2006-0072469

(51) Int. Cl.
*H01L 21/62* (2006.01)
(52) U.S. Cl. ........... 438/482; 257/E21.004; 257/E21.52; 438/102; 438/103; 438/692
(58) Field of Classification Search ........... 257/E21.004, 257/E21.52; 438/102, 103, 482, 690–692
See application file for complete search history.

(56) References Cited

U.S. PATENT DOCUMENTS

| | | | |
|---|---|---|---|
| 6,897,467 B2 | 5/2005 | Doan et al. | |
| 7,408,240 B2 * | 8/2008 | Zaidi | 257/613 |
| 7,619,311 B2 * | 11/2009 | Lung | 257/774 |
| 7,803,679 B2 * | 9/2010 | Park et al. | 438/237 |
| 7,879,643 B2 * | 2/2011 | Lung | 438/95 |
| 7,883,958 B2 * | 2/2011 | Park | 438/237 |
| 2001/0044209 A1 * | 11/2001 | Evans | 438/692 |
| 2003/0036232 A1 * | 2/2003 | Dennison | 438/257 |
| 2005/0227496 A1 | 10/2005 | Park et al. | |
| 2006/0046509 A1 * | 3/2006 | Gwan-Hyeob | 438/758 |
| 2006/0099795 A1 * | 5/2006 | Lee et al. | 438/618 |
| 2006/0169968 A1 * | 8/2006 | Happ | 257/2 |
| 2007/0267618 A1 * | 11/2007 | Zaidi et al. | 257/2 |
| 2008/0191187 A1 * | 8/2008 | Lung et al. | 257/4 |

FOREIGN PATENT DOCUMENTS

| KR | 10-2006-0001105 A | 1/2006 |
|---|---|---|
| KR | 10-0546406 B1 | 1/2006 |

* cited by examiner

*Primary Examiner* — Anh Phung
*Assistant Examiner* — Michael Lulis
(74) *Attorney, Agent, or Firm* — Myers Bigel Sibley & Sajovec, P.A.

(57) ABSTRACT

A phase changeable memory device is manufactured by forming at least one insulating layer on a substrate. A preliminary first electrode is formed on the insulating layer. The preliminary first electrode is partially etched to form a first electrode electrically connected to the substrate. After the preliminary first electrode is formed, both sidewalls of the preliminary first electrode are partially etched isotropically to form a first electrode having a uniform width and height. A phase changeable material layer pattern and a second electrode are subsequently formed on the first electrode. Related devices also are described.

9 Claims, 11 Drawing Sheets

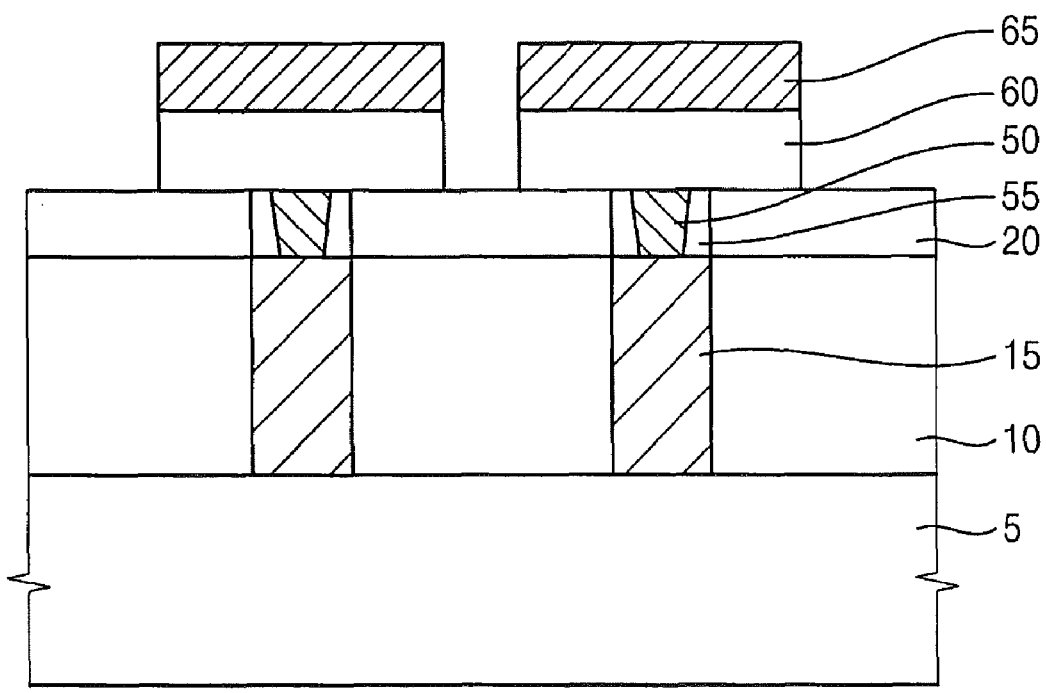

METHODS OF MANUFACTURING VARIABLE RESISTANCE NON-VOLATILE MEMORY DEVICES INCLUDING A UNIFORMLY NARROW CONTACT LAYER

CROSS-REFERENCE TO RELATED APPLICATION

This application claims the benefit under 35 USC §119 of Korean Patent Application No. 10-2006-0072469, filed on Aug. 1, 2006, the disclosure of which is hereby incorporated herein by reference in its entirety as if set forth fully herein.

FIELD OF THE INVENTION

The present invention relates to non-volatile memory devices and manufacturing methods therefor; and more specifically to variable resistance non-volatile memory devices and manufacturing methods therefor.

BACKGROUND OF THE INVENTION

Integrated circuit (semiconductor) memory devices include dynamic random access memory (DRAM) devices, static random access memory (SRAM) devices, flash memory devices, etc. In addition, the memory devices may be classified as volatile memory devices or non-volatile memory devices. The non-volatile memory devices may retain their data even though power is off. On the other hand, the volatile memory devices may lose their data when power is off. The non-volatile memory devices, such as a flash memory devices, have been widely employed in digital cameras, MP3 (MPEG audio layer-3) players and cellular phones, etc.

Non-volatile memory devices using a resistive material include, for example, a resistive random access memory (RRAM), a phase change RAM (PRAM), and a magnetic RAM (MRAM). While a dynamic RAM or a flash memory uses charge to store data, the non-volatile memory device using the resistive material stores data using a variation in the resistance of a variable resistive material (RRAM), a variation in the state of a phase change material (PRAM), such as a chalcogenide alloy, or a variation in the resistance of a magnetic tunnel junction (MTJ) thin film according to the magnetization state of a ferromagnetic substance (MRAM).

A resistive memory cell generally includes a first electrode, a second electrode, and a variable resistive material interposed therebetween, and the resistance level of the variable resistive material varies according to a voltage applied between the first and second electrodes.

A PRAM device may include a phase changeable material layer. When heat is applied to the phase changeable material layer, the phase changeable material layer may change its phase so that a resistance in the phase changeable material layer may vary. Generally, the phase changeable material layer may be formed using a chalcogenide compound including germanium (Ge), antimony (Sb) and/or tellurium (Te). Current applied to the phase changeable material layer through an electrode may generate the heat for changing a phase of the phase changeable material layer. The phase of the phase changeable material layer may vary depending on the amount of current and/or a time for which the current is provided. The resistance of the phase changeable material layer may vary in accordance with a state of the phase changeable material layer. Particularly, when the phase changeable material layer has a crystalline state, the resistance of the phase changeable material layer may be relatively small. On the other hand, when the phase changeable material layer has an amorphous state, the resistance of the phase changeable material layer may be relatively large. As a result, the PRAM device including the phase changeable material layer may be employed as a logic device by using a difference in resistance.

Phase changeable memory devices are disclosed in U.S. Pat. No. 6,987,467 to Doan et al., entitled "Controllable Ovanic Phase-Change Semiconductor Memory Device", U.S. Patent Application Publication No. 2005/0227496 to Park et al., entitled "Phase Change Memory Elements and Methods of Fabricating Phase Change Memory Elements Having a Confined Portion of Phase Change Material on a Recessed Contact", and Korean Patent Laid-Open Publication No. 10-2006-0001105 to Chang, entitled "Phase-Change Memory Device and Fabricating Method Thereof to Reduce Area of Contact Surface Between Phase-Change Layer Pattern and Upper/Lower Electrode.

FIGS. 1A to 1E are cross-sectional views illustrating a conventional method of manufacturing a phase changeable memory device.

Referring to FIG. 1A, an insulating interlayer 10 is formed on a semiconductor substrate 5 by using an oxide. A contact hole exposing a predetermined portion of the substrate 5 may be then formed by etching the insulating interlayer 10.

A first conductive layer is formed on the insulating interlayer 10 to fill up the contact hole. A pad 15 making contact with the predetermined portion of the substrate 5 may be then formed by partially removing the first conductive layer until the insulating interlayer 10 is exposed.

A second insulating layer 25 and a first insulating layer 20 are formed and subsequently etched by a photolithography process so that an opening 30 exposing the pad 15 may be formed.

Referring to FIG. 1B, a third insulating layer is formed on the exposed pad 15, sidewalls of the opening 30 and the second insulating layer 25. The third insulating layer may be then etched by an anisotropic etching process so that a preliminary spacer 35 may be formed on the sidewalls of the opening 30. The preliminary spacer 35 may be formed using a nitride. Thus, a lower width of the opening 30 may become smaller than an upper width of the opening 30 because the preliminary spacer 35 is formed on the sidewalls of the opening 30.

A second conductive layer 40 is formed on the pad 15 and the second insulating layer 25 to fill up the opening 30. The second conductive layer 40 may be formed using a metal nitride such as titanium nitride or titanium aluminum nitride.

Referring to FIG. 1C, the second conductive layer 40 is polished by a chemical mechanical polishing (CMP) process until the second insulating layer 25 is exposed. Thus, a preliminary lower electrode 45 filling up the opening may be formed on the pad 15.

The second insulating layer 25 is removed by an etch-back process so that upper portions of the preliminary lower electrode 45 and the preliminary spacer 35 are exposed over the first insulating layer 20. As described above, the lower width of the opening 30 is smaller than the upper width of the opening 30. As a result, a lower width of the preliminary lower electrode 45 filling up the opening 30 may be smaller than an upper width of the preliminary lower electrode 45.

Referring to FIG. 1D, upper portions of the preliminary lower electrode 45 and the preliminary spacer 35 protruded upwardly from the first insulating layer 20 are removed by the CMP process so that a lower electrode 50 and a spacer 55 may be formed on the pad 15. Heights of the lower electrode 50 and the spacer 55 may be substantially the same as that of the first insulating layer 20.

Referring to FIG. 1E, a phase changeable material layer and a third electrode layer are formed on the lower electrode 50, the spacer 55 and the first insulating layer 20. Thereafter, the phase changeable material layer and the third electrode layer are patterned so that a phase changeable material layer pattern 60 and an upper electrode 65 may be formed.

SUMMARY OF THE INVENTION

Variable resistance memory devices according to various embodiments of the present invention include a variable resistance layer on a substrate and a three-layer contact that electrically connects the variable resistance layer to the substrate. The three-layer contact includes a first contact layer adjacent the substrate, a second contact layer adjacent the variable resistance layer, and a third contact layer between the first contact layer and the second contact layer. The second contact layer is narrower than the third contact layer, and is of uniform cross-section along a height thereof. In some embodiments, the third contact layer comprises a diode. In some embodiments, the variable resistance layer comprises a phase changeable memory layer. In some embodiments, a sidewall spacer is provided on a sidewall of the second contact layer and in some embodiments, the first, second and third contact layers comprise polysilicon of differing widths.

Variable resistance memory devices according to other embodiments of the present invention include a variable resistance layer on a substrate and a first contact layer between the variable resistance layer and the substrate, and directly on the variable resistance layer. The first contact layer has uniform cross-section along a height thereof. A second contact layer is provided between the first contact layer and the substrate, and directly on the first contact layer, wherein the first contact layer is narrower than the second contact layer. The second contact layer may comprise a diode. The variable resistance layer may comprise a phase changeable memory layer. A sidewall spacer also may be provided on a sidewall of the first contact layer.

Variable resistance memory devices may be manufactured, according to various embodiments of the present invention, by forming an insulating layer on a substrate and forming an electrode that protrudes away from the insulating layer. The electrode is isotropically etched, to uniformly narrow the electrode that protrudes away from the insulating layer. A variable resistance layer is then formed on the electrode and, in some embodiments, directly on the electrode, that has been uniformly narrowed. In some embodiments, prior to forming the electrode that protrudes away from the insulating layer, a diode is formed in the insulating layer and, in some embodiments, the electrode that protrudes away from the insulating layer is isotropically etched to uniformly narrow the electrode that protrudes away from the insulating layer to be narrower than the diode. In other embodiments, a spacer is formed on the sidewall of the electrode that has been uniformly narrowed.

In some embodiments, the electrode that protrudes away from the insulating layer is formed by forming a second insulating layer, etching the second insulating layer to form a via therein, forming a conductive layer in the via and on the second insulating layer outside the via, removing the conductive layer from the second insulating layer outside the via so that at least some of the conductive layer remains in the via and removing at least some of the second insulating layer.

In other embodiments of the present invention, methods of manufacturing a phase changeable memory device are provided. In these methods, at least one insulating layer is formed on a substrate. A preliminary first electrode is formed on the insulating layer. A first electrode electrically connected to the substrate is formed on the insulating layer by partially etching the preliminary first electrode. A phase changeable material layer pattern is formed on the first electrode. A second electrode is formed on the phase changeable material layer pattern.

To form at least one insulating layer, a first insulating layer may be formed on the substrate. A second insulating layer may be formed on the first insulating layer. A third insulating layer may be formed on the second insulating layer. In some embodiments, the first insulating layer and the third insulating layer may be formed using a material having an etching selectivity with respect to the second insulating layer. For example, the first insulating layer and the third insulating layer may be formed using oxides. The second insulating layer may be formed using a nitride and/or an oxy-nitride.

To form the preliminary first electrode in some embodiments, an opening may be formed by partially etching the third insulating layer, the second insulating layer and the first insulating layer. A diode partially filling the opening may be formed. The preliminary first electrode filling up the opening may be formed on the diode. The third insulating layer may be removed. The preliminary first electrode may be formed using polysilicon doped with impurities. The first electrode may be formed by isotropically etching the preliminary first electrode. The preliminary first electrode may be etched by using an etching solution including ammonia, hydrogen peroxide and deionized water.

To manufacture the phase changeable memory device in other embodiments, a spacer may be further formed on sidewalls of the first electrode. The spacer may be formed using a material having an etching selectivity with respect to the first electrode. The spacer may be formed using a nitride, an oxide and/or an oxy-nitride.

In accordance with other embodiments of the present invention, other methods of manufacturing phase changeable memory devices are provided. In these methods, a contact region is formed on a substrate. At least one insulating layer is formed on the substrate. The insulating layer has a diode electrically connected to the contact region. A preliminary first electrode is formed on the diode. A first electrode is formed on the diode by partially etching the preliminary first electrode. An insulating interlayer covering the first electrode is formed on the insulating layer. A phase changeable material layer pattern is formed on the first electrode and the insulating interlayer. A second electrode is formed on the phase changeable material layer pattern.

To form the insulating interlayer, a preliminary insulating interlayer covering the first electrode is formed on the insulating layer. The insulating interlayer covering the first electrode is formed by performing a chemical mechanical polishing (CMP) process on the preliminary insulating interlayer with a slurry composition including a cerium oxide.

According to some embodiments of the present invention, after the preliminary first electrode including polysilicon is formed, both side portions of the preliminary first electrode are partially etched so that the first electrode having a relatively uniform cross-section and height may be formed. In addition, the spacer may be additionally formed on the sidewalls of the first electrode having a relatively uniform size. Therefore, the first electrode and the diode may make contact with each other satisfactorily regardless of a subsequent polishing process. In addition current may be uniformly provided to the phase changeable material layer pattern through the first electrode having the relatively uniform size so that electrical characteristics of the phase changeable memory device may be improved.

BRIEF DESCRIPTION OF THE DRAWINGS

The above and other features and advantages of the present invention will become readily apparent by reference to the following detailed description when considered in conjunction with the accompanying drawings wherein:

FIGS. 1A to 1E are cross-sectional views illustrating a conventional method of manufacturing a phase changeable memory device;

DETAILED DESCRIPTION

Figure 1A:
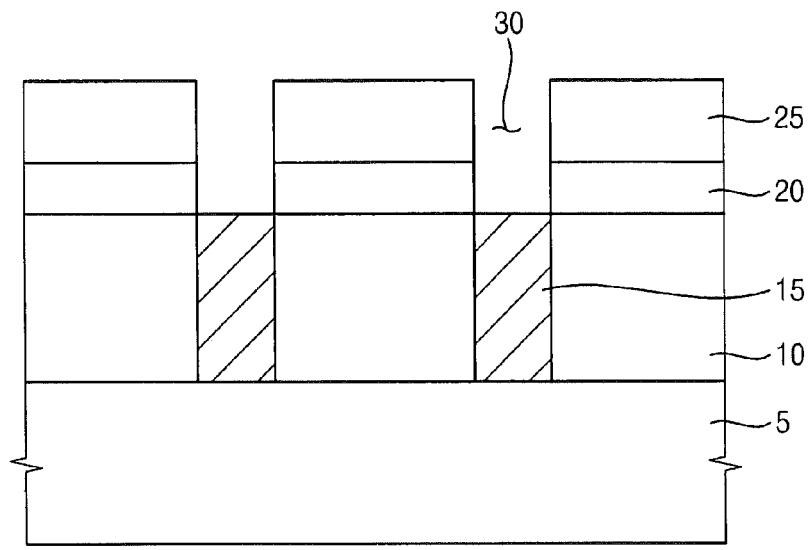
Figure 1B:
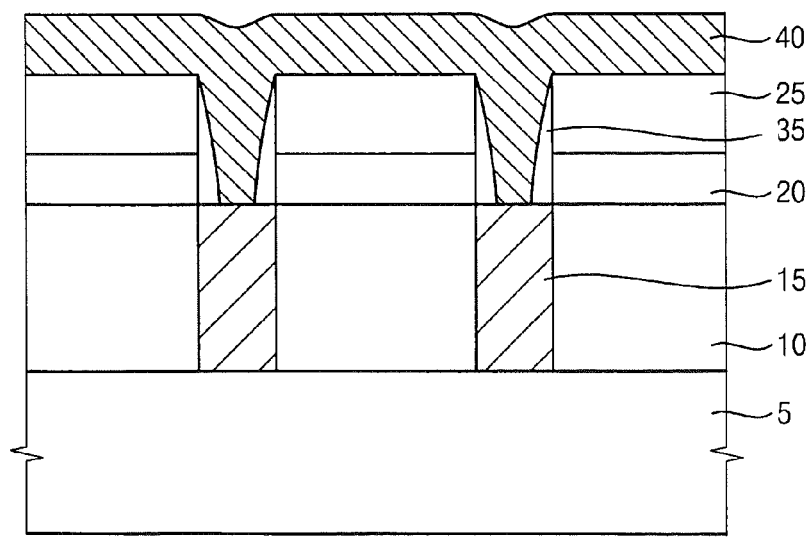
Figure 1C:
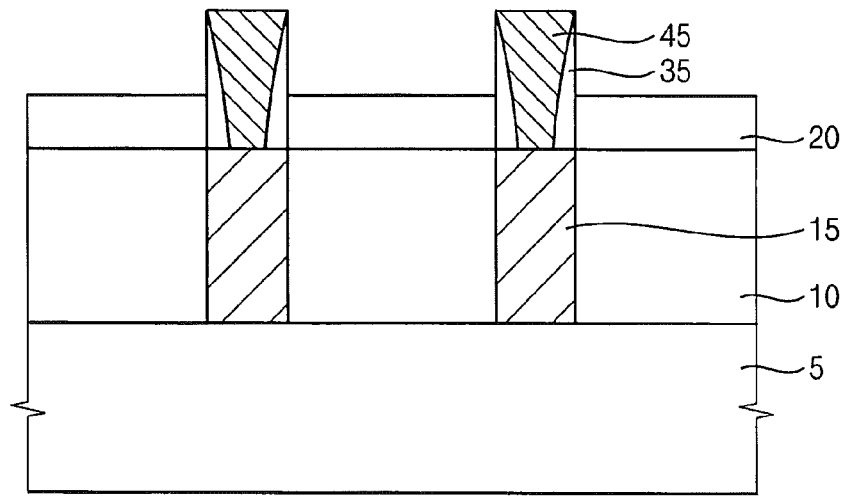
Figure 1D:
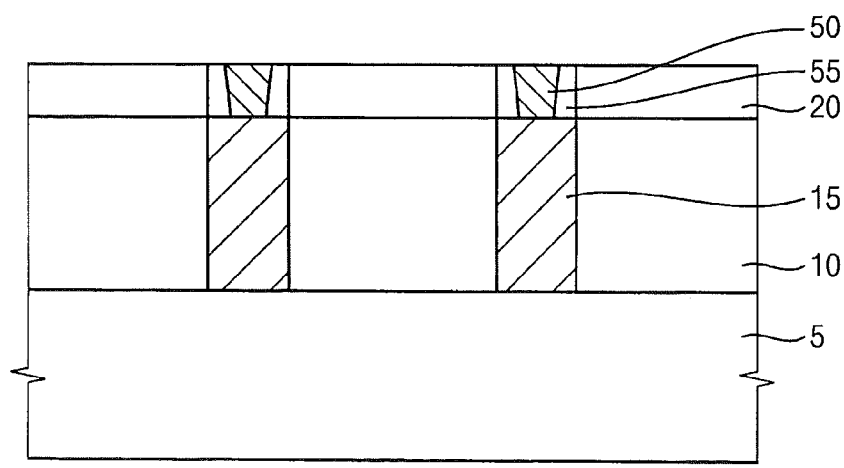

The present invention will now be described more fully hereinafter with reference to the accompanying drawings, in which exemplary embodiments of the invention are illustrated. The invention may, however, be embodied in different forms and should not be construed as limited to the embodiments set fourth herein. Rather, these embodiments are provided so that this disclosure will be thorough and complete, and will fully convey the scope of the invention to those skilled in the art.

It will be understood that when an element or layer is referred to as being "on," "connected to" and/or "coupled to" another element or layer, the element or layer may be directly on, connected and/or coupled to the other element or layer, or intervening elements or layers may be present. In contrast, when an element is referred to as being "directly on," "directly connected to" and/or "directly coupled to" another element or layer, no intervening elements or layers are present. As used herein, the term "and/or" includes any and all combinations of one or more of the associated listed items.

It will also be understood that, although the terms "first," "second," etc., may be used herein to describe various elements, components, regions, layers and/or sections, these elements, components, regions, layers and/or sections should not be limited by these terms. Rather, these terms are used merely as a convenience to distinguish one element, component, region, layer and/or section from another element, component, region, layer and/or section. For example, a first element, component, region, layer and/or section could be termed a second element, component, region, layer and/or section without departing from the teachings of the present invention.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly. As used herein, "height" refers to a direction that is generally orthogonal to the faces of a substrate.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention. Like reference numerals refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some embodiments of the invention may arise from a discovery that, in the conventional method of manufacturing the phase changeable memory device illustrated in FIGS. 1A-1E, the spacer 55 is formed to decrease the cross-section of the lower electrode 50 so that the upper width of the lower electrode 50 may be different from the lower width of the lower electrode 50. Thus, the lower electrode 50 heating the phase changeable material layer pattern 60 and making ohmic contact with the phase changeable material layer pattern 60 may not have a uniform size. As a result, characteristics of the phase changeable memory device may be deteriorated. In addition, when the etching process for forming the spacer 55 on the sidewalls of the opening 30 is insufficiently performed, the pad 15 may not be exposed. In this case, the lower electrode 50 may be disconnected from the pad 15. On the other hand, when the etching process for forming the spacer 55 is excessively performed, the pad 15 may be partially etched. In this case, the pad 15 may be disconnected from the lower electrode 50 or the electrical characteristics of the phase changeable memory device may be deteriorated due to a decrease of the height of the pad 15.

In sharp contrast, some embodiments of the present invention provide a contact layer that is of uniform cross-section along a height thereof. The contact layer may be manufactured by forming an electrode that protrudes away from an insulating layer, and then isotropically etching the electrode that protrudes away from the insulating layer, to uniformly narrow the electrode that protrudes away from the insulating layer.

FIGS. 2A to 2K are cross-sectional views illustrating methods of manufacturing variable resistance memory devices, such as phase changeable memory devices, in accordance with various embodiments of the present invention.

Figure 2A:
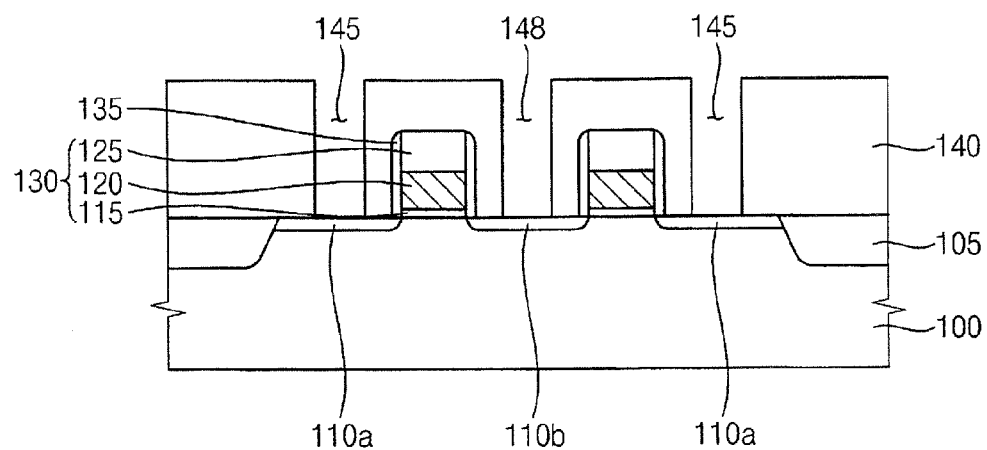
FIGS. 2A to 2K are cross-sectional views illustrating methods of manufacturing variable resistance memory devices, such as phase changeable memory devices, and devices so formed, in accordance with various embodiments of the present invention.

Referring to FIG. 2A, an isolation layer 105 is formed at a surface portion of a substrate 100 to divide the substrate 100 into an active region and a field region. The field region may correspond to the isolation layer 105. The active region may correspond to a portion of the substrate 100 enclosed by the field region.

The substrate 100 may be a bulk semiconductor substrate such as a silicon wafer, a multilayer substrate, such as a silicon-on-insulator (SOI) substrate, a metal oxide single-crystal substrate and/or any other microelectronic substrate. The isolation layer 105 may be formed at the surface portion of the substrate 100 by an isolation process such as a shallow trench isolation (STI) process, a local oxidation of silicon (LOCOS) process, etc.

A gate insulating layer, a gate conductive layer and a gate mask layer may be successively formed on the active region of the substrate 100. As one example, the gate mask layer, the gate conductive layer and the gate insulating layer may be successively etched by a photolithography process so that gate structures 130 may be formed on the active region. Each of the gate structures 130 includes a gate insulating layer pattern 115, a gate electrode 120 and a gate mask 125 that are successively formed on the active region. As another example, the gate mask 125 may be formed on the gate conductive layer by etching the gate mask layer. Thereafter, the gate conductive layer and the gate insulating layer may be successively etched using the gate mask 125 as an etching mask so that the gate structures 130 may be formed on the substrate 100.

The gate insulating layer pattern 115 may be formed using an oxide and/or a metal oxide. For example, the gate insulating layer pattern 115 may be formed using silicon oxide, hafnium oxide (HfOx), zirconium oxide (ZrOx), tantalum oxide (TaOx), aluminum oxide (AlOx), etc. These can be used alone or in a mixture thereof. Other material(s)/process(es) also may be used.

The gate electrode 120 may be formed using polysilicon doped with impurities, a metal or a metal nitride. For example, the gate electrode 120 may be formed using tungsten (W), aluminum (Al), titanium (Ti), titanium nitride (TiN), tungsten nitride (WN), tantalum nitride (TaN), etc. These can be used alone or in a mixture thereof. Alternatively, the gate electrode 120 may have a multi-layered structure formed by depositing a polysilicon doped with impurities, a metal, a metal nitride and/or a metal silicide. For example, the metal silicide may include cobalt silicide (CoSix), titanium silicide (TiSix), tantalum silicide (TaSix), etc. Other material(s)/process(es) also may be used.

The gate mask 125 may be formed using a material having an etching selectivity with respect to the gate electrode 120 and the gate insulating layer pattern 115. For example, the gate mask 125 is formed using a nitride and/or an oxynitride. The nitride may be silicon nitride. The oxynitride may be silicon oxynitride and/or titanium oxynitride. Other material(s)/process(es) may be used.

Referring again to FIG. 2A, an insulating layer is formed on the substrate 100 to cover the gate structure 130. A gate spacer 135 is then formed on a sidewall of each the gate structure 130 by etching the insulating layer. For example, the gate spacer 135 is formed using a nitride such as silicon nitride. In addition, the gate spacer 135 may be formed by an anisotropic etching process.

Impurities are doped into portions of the substrate 100 adjacent to the gate structures 130 by an ion implantation process to form a first contact region 110a and a second contact region 110b at the portions of the substrate 100 adjacent to the gate structure 130. The gate structure 130 may be used as an ion implantation mask in the ion implantation process. For example, the first and second contact regions 110a and 110b may correspond to source/drain regions, respectively.

Transistors including the gate structures 130 and the first and second contact regions 110a and 110b may be provided on the substrate 100 by forming the first and second contact regions 110a and 110b.

A first insulating interlayer 140 is formed on the substrate 100 to cover the transistors. The first insulating interlayer 140 may be formed using an oxide. For example, the first insulating interlayer 140 is formed using boro-phospho-silicate glass (BPSG), phospho-silicate glass (PSG), tetra-ethyl-ortho-silicate (TEOS), undoped silicate glass (USG), flowable oxide (FOX), spin-on-glass (SOG), plasma-enhanced tetra-ethyl-ortho-silicate (PE-TEOS), high-density plasma chemical vapor deposition (HDP-CVD) oxide and/or other material(s)/process(es). An upper portion of the first insulating interlayer 140 may be polished by a chemical mechanical polishing (CMP) process, an etch-back process or a combination process of CMP and etch back. Thus, the upper portion of the first insulating interlayer 140 may be planarized.

The first insulating interlayer 140 is partially etched by a photolithography process so that a first contact hole 145 and a second contact hole 148 may be formed through the first insulating interlayer 140. The first and second contact holes 145 and 148 expose the first and second contact regions 110a and 110b, respectively.

Figure 2B:
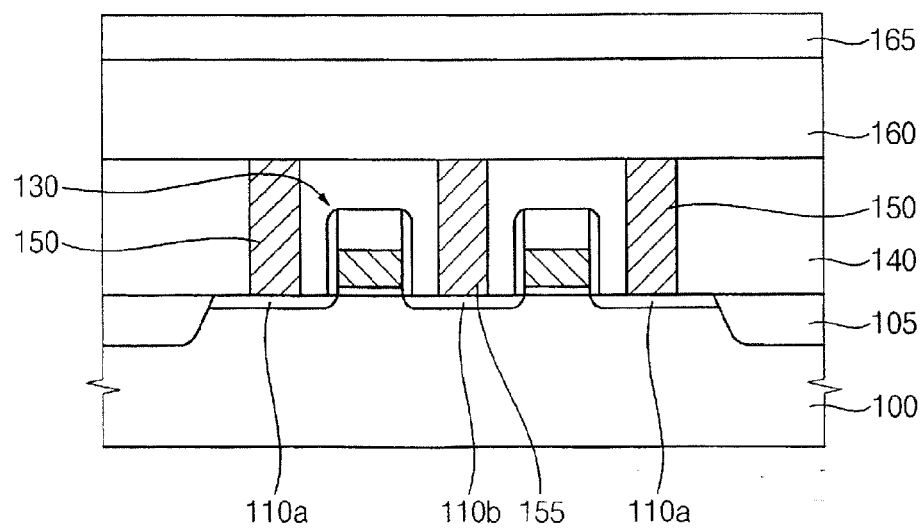

Referring to FIG. 2B, a lower conductive layer is formed on the first insulating interlayer 140 to fill up the first and second contact holes 145 and 148. The lower conductive layer may be formed using doped polysilicon, a metal, a metal nitride and/or other material(s). For example, the lower conductive layer may be formed using tungsten, aluminum, titanium, copper, tantalum, tungsten nitride, aluminum nitride, titanium nitride, titanium aluminum nitride, etc. These can be used alone or in a mixture thereof.

The lower conductive layer is removed until the first insulating interlayer 140 is exposed by a CMP process and/or an etch-back process. Accordingly, a first pad 150 and a second pad 155 filling up the first and second contact holes 145 and 148, respectively, may be formed. The first pad 150 filling the first contact hole 145 may be located on the first contact region 110a. The second pad 155 filling the second contact hole 148 may be located on the second contact region 110b. The first and second pads 150 and 155 may make electric contact with the first and second contact regions 110a and 110b, respectively. Other material(s)/process(es) may be used.

A first insulating layer 160 is formed on the first pad 150, the second pad 155 and the first insulating interlayer 140. The first insulating layer 160 may be formed using an oxide by a chemical vapor deposition (CVD) process, a plasma-enhanced chemical vapor deposition (PECVD) process, an HDP-CVD process and/or other processes. For example, the first insulating layer 160 may be formed using TEOS, PE-TEOS, USG, SOG, FOX, PSG, BPSG, HDP-CVD oxide, etc. These can be used alone or in a mixture thereof. In some embodiments of the present invention, the first insulating layer 160 and the first insulating interlayer 140 are formed using substantially the same oxides. In other embodiments of the present invention, the first insulating layer 160 and the first insulating interlayer 140 are formed using substantially different oxides. Other material(s)/process(es) may be used.

A second insulating layer 165 is formed on the first insulating layer 160. The second insulating layer 165 may be formed using a material having an etching selectivity with respect to the first insulating layer 160. In some embodiments of the present invention, the second insulating layer 165 is formed using a nitride such as silicon nitride and/or an oxynitride such as silicon oxynitride. In other embodiments of the present invention, the second insulating layer 165 is formed using silicon-rich nitride or silicon-rich oxynitride that has relatively high silicon content. The second insulating layer 165 may be formed by a CMP process, an LPCVD process and/or a PECVD process. In some embodiments of the present invention, the second insulating layer 165 serves as an etching mask and a polishing stop layer during subsequent etching and/or polishing processes. Other material(s)/process (es) may be used.

Figure 2C:
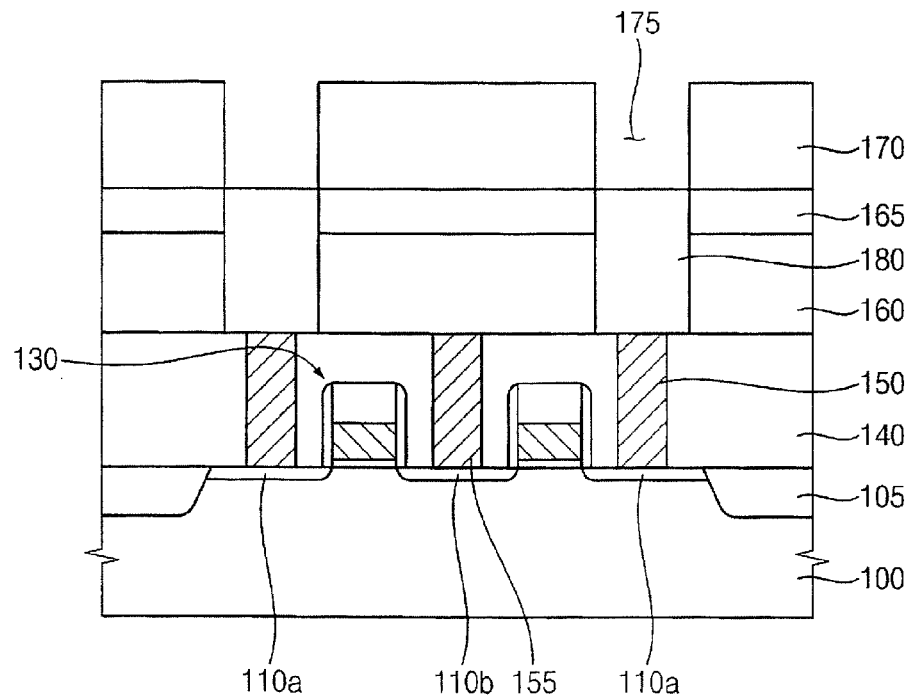

Referring to FIG. 2C, a third insulating layer 170 is formed on the second insulating layer 165. The third insulating layer 170 may be formed using a material having an etching selectivity with respect to the second insulating layer 165. The third insulating layer 170 may be formed by a CVD process, a PECVD process and/or an HDP-CVD process. For example, the third insulating layer 170 may be formed using USG, SOG, FOX, TEOS, PE-TEOS, PSG, BPSG, etc. In some embodiments of the present invention, the third insulating layer 170 may be formed using an oxide substantially the same as that included in the first insulating layer 160 and/or the first insulating interlayer 140. In other embodiments of the present invention, the first insulating interlayer 140, the first insulating layer 160 and the third insulating layer 170 may be formed using substantially different oxides. Other material(s)/process(es) may be used.

After a photoresist pattern (not shown) is formed on the third insulating layer 170, the third insulating layer 170, the second insulating layer 165 and the first insulating layer 160 are partially etched using the photoresist pattern as an etching mask so that an opening 175 is formed through the third insulating layer 170, the second insulating layer 165 and the first insulating layer 160. The first pad 150 may be exposed through the opening 175. After the opening 175 is formed, the photoresist pattern may be removed from the third insulating layer 170 by an ashing process and/or a striping process. Other material(s)/process(es) may be used.

As illustrated in FIG. 2C, a diode 180, which partially fills up the opening 175 located over the first pad 150, is formed in the opening 175. For example, the diode 180 may be formed by a selective epitaxial growth process and may be fabricated to provide a p-n junction therein. In some embodiments of the present invention, the diode 180 includes polysilicon which grows using the first insulating interlayer 140 and/or the first insulating layer 160 as a seed layer. The diode 180 partially filling the opening 175 may have a thickness substantially the same as a total thickness of the first and second insulating layers 160 and 165. In other embodiments of the present invention, after a preliminary diode is formed on the first pad 150 to fill up the opening 175, the preliminary diode is partially removed so that the diode 180 partially filling the opening 175 may be formed on the first pad 150. Other material (s)/process(es) may be used.

Figure 2D:
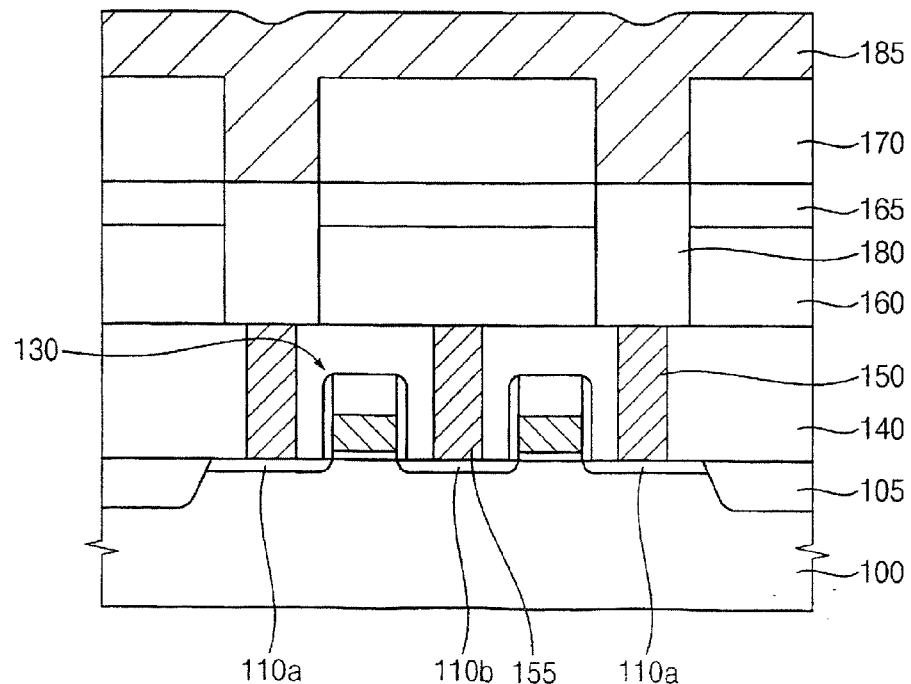

Referring to FIG. 2D, a first electrode layer 185 is formed on the diode 180 and on the third insulating layer 170 to fill up the opening 175. The polysilicon doped with the impurities may be deposited by the LPCVD process and/or the PECVD process so as to form the first electrode layer 185. The first electrode layer 185 may fill up the opening 175. The first electrode layer 185 may have a predetermined thickness measured from the upper surface of the third insulating layer 170. Other material(s)/process(es) may be used.

Figure 2E:
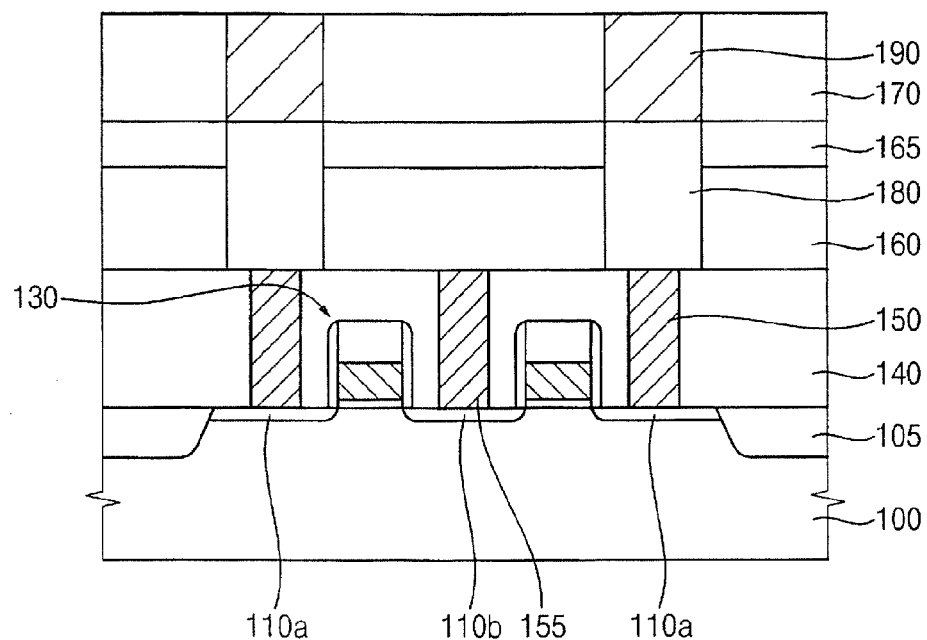

Referring to FIG. 2E, the first electrode layer 185 is partially removed until the third insulating layer 170 is exposed so that a preliminary first electrode 190 filling up the opening 175 may be formed. The first electrode layer 185 may be partially removed by the CMP process and/or the etch-back process. When the thickness of the diode 180 is substantially the same as the total thickness of the first and second insulating layers 160 and 165, the thickness of the preliminary first electrode 190 may be substantially the same as the thickness of the third insulating layer 170. Other material(s)/process (es) may be used.

Figure 2F:
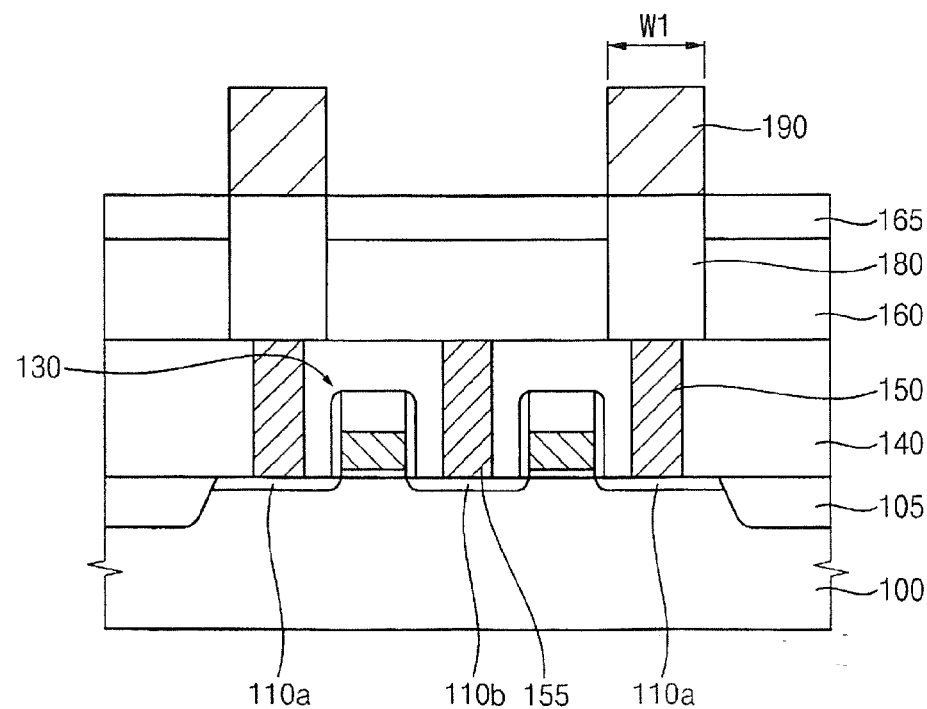

Referring to FIG. 2F, the third insulating layer 170 is removed using the second insulating layer 165 as an etch-stop layer so that the preliminary first electrode 190 may protrude over the second insulating layer 165. For example, the third insulating layer 170 is etched by a wet etching process with a solution including buffered oxide etchant (BOE) and hydrogen fluoride (HF). The third insulating layer 170 is removed so that the preliminary first electrode 190 having a first width W1 may protrude from the second insulating layer 165 having a substantial pillar shape. Other material(s)/process(es) may be used.

Figure 2G:
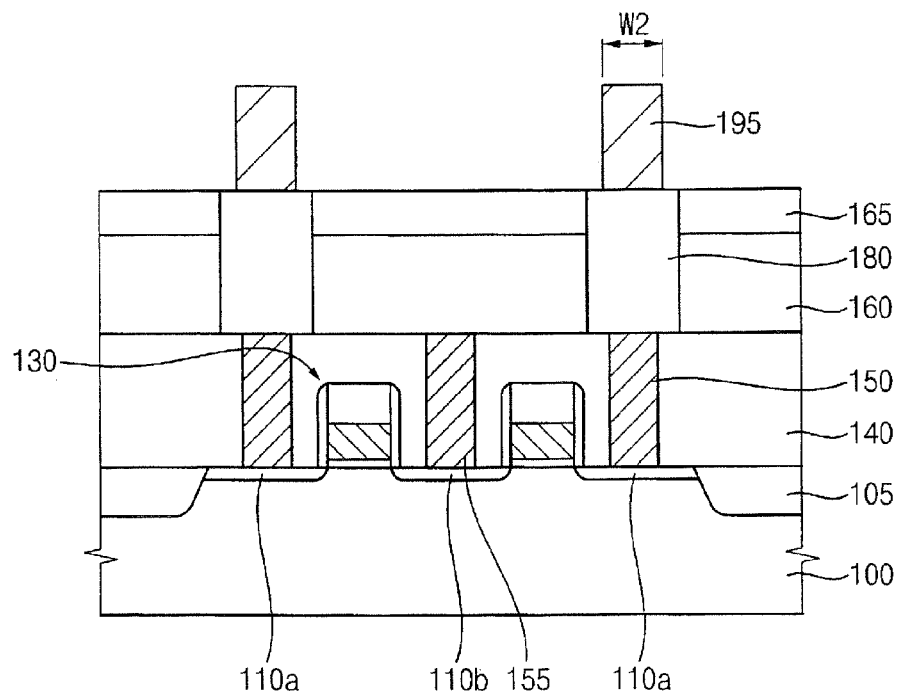

Referring to FIG. 2G, the preliminary first electrode 190 is partially removed by an isotropic etching process so that a first electrode 195 having a second width W2 may be formed on the diode 180. In some example embodiments of the present invention, both edge portions of the preliminary first electrode 190 are partially etched by using a solution including ammonia ($NH_4OH$), hydrogen peroxide ($H_2O_2$) and deionized (DI) water so that the first electrode having the second width W2 that is smaller than the first width W1 may be formed. For example, the first electrode 195 is formed using an SC-1 solution during an isotropic etching process. Accordingly, upper and lower portions of the first electrode 195 may have substantially the same widths so that the first electrode 195 having the second width W2 may be formed on the diode 180. Here, the second width W2 may be narrow compared with the first width W1 and uniform along the height (thickness) thereof. Other material(s)/process(es) may be used.

Figure 2H:
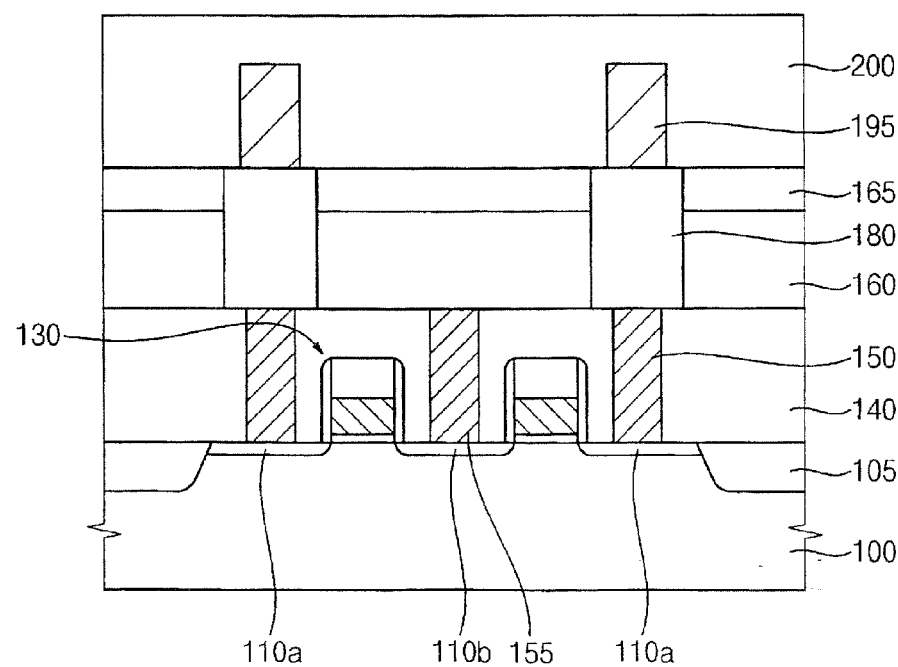

Referring to FIG. 2H, a preliminary second insulating interlayer 200 covering the first electrode 195 that has the uniform second width W2 is formed on the second insulating layer 165. The preliminary second insulating interlayer 200 may have a sufficient thickness measured from the surface of the second insulating layer 165 such that the first electrode 195 may be fully covered by the preliminary second insulating interlayer 200. The preliminary second insulating interlayer 200 may be formed using USG, SOG, FOX, PSG, BPSG, TEOS, PE-TEOS, HDP-CVD oxide, etc. Other material(s)/process(es) may be used. In some embodiments of the present invention, the preliminary second insulating interlayer 200 is formed using an oxide substantially the same as that included in the third insulating layer 170, the first insulating layer and/or the first insulating interlayer 140. In other embodiments of the present invention, the preliminary second insulating interlayer 200, the third insulating layer 170, the first insulating layer and/or the first insulating interlayer 140 may be formed using different oxides.

Figure 2I:
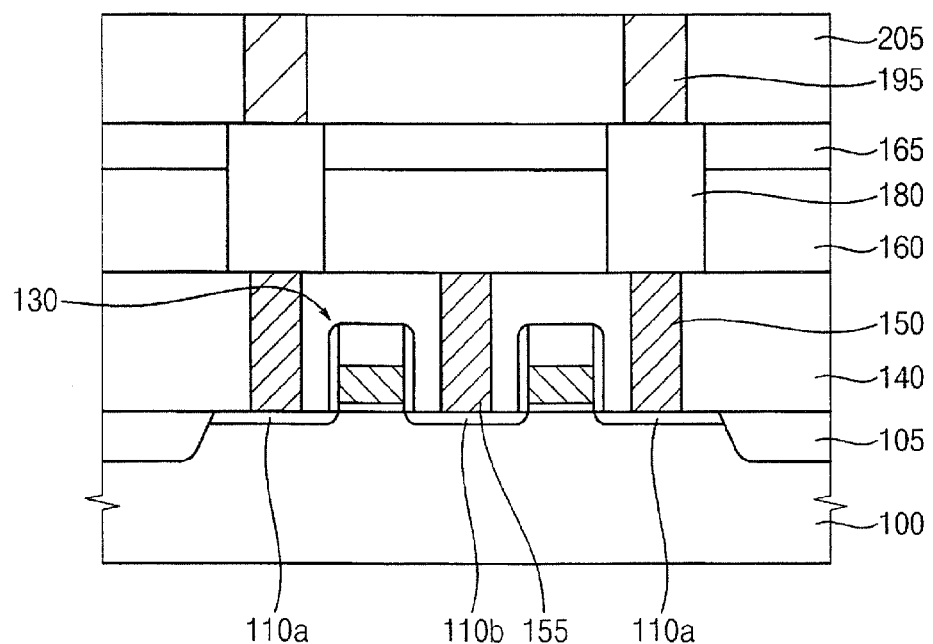

Referring to FIG. 2I, the preliminary second insulating interlayer 200 is partially removed until the first electrode 195 is exposed so that a second insulating interlayer 205, which fills up the first electrode 195 and has a flat upper surface, may be formed. The preliminary second insulating interlayer 200 may be partially removed using a slurry composition for polishing the oxide during a CMP process; For example, the slurry composition may include cerium oxide ($CeO_2$) to efficiently form the second insulating interlayer 205. Here, additives adjusting a pH of the slurry composition may be used to increase a difference in etch rate between the preliminary second insulating interlayer 200 and the first electrode 195. Other material(s)/process(es) may be used.

Figure 2J:
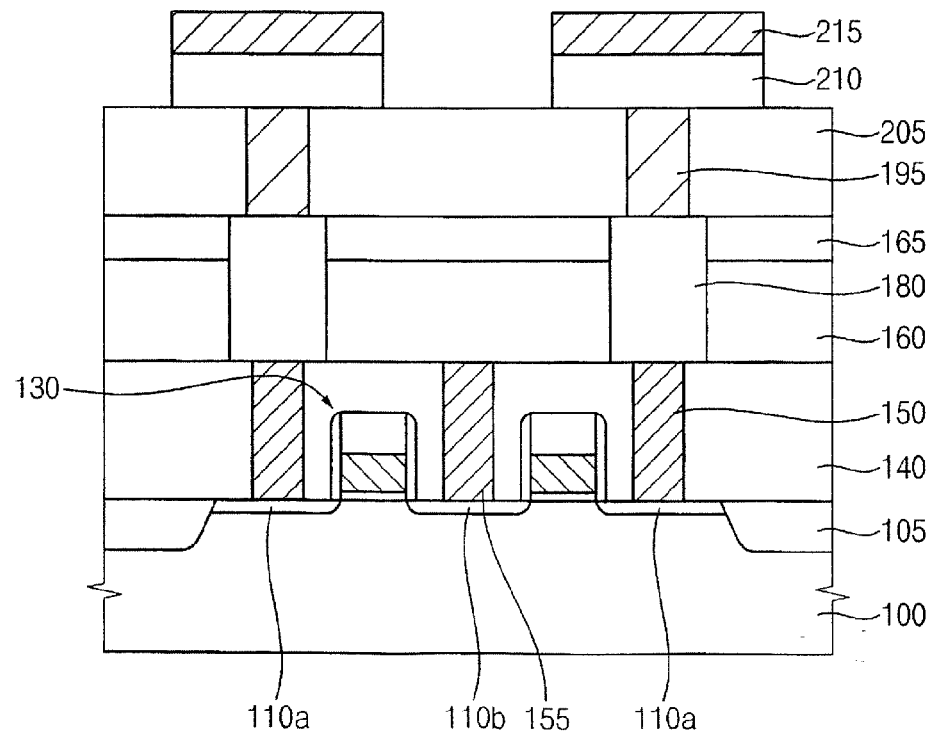

Referring to FIG. 2J, after a phase changeable material layer and a second electrode layer are successively formed on the first electrode 195 and the second insulating interlayer 205, the second electrode layer and the phase changeable material layer are patterned through a photolithography process so that a phase changeable material layer pattern 210 and a second electrode 215 may be formed on the first electrode 195. The phase changeable material layer pattern 210 may be formed using a chalcogenide compound. In some embodiments of the present invention, the phase changeable material layer pattern 210 may be formed using an element in Group V-antimony-tellurium. Examples of the element in Group V-antimony-tellurium may include germanium-antimony-tellurium (Ge—Sb—Te), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), tantalum (Ta), niobium (Nb) or vanadium (V). In other embodiments of the present invention, the phase changeable material layer pattern 210 may be formed using an element in Group VI-antimony-tellurium. Examples of the element in Group VI-antimony-tellurium may include tungsten (W), molybdenum (Mo) or chromium (Cr). In other embodiments of the present invention, the phase changeable material layer pattern 210 may be formed using an element in Group V-antimony-selenium. In still other embodiments of the present invention, the phase changeable material layer pattern 210 may be formed using an element in Group VI-antimony-selenium. Other material (s)/process(es) may be used. Additionally, the phase changeable material layer pattern 210 may be formed by the sputtering process, the CVD process, the pulse laser deposition process or the atomic layer deposition (ALD) process. Other variable resistance layer(s) may be formed, in other embodiments, using other process(es).

The second electrode 215 may be formed by the sputtering process, the CVD process, the atomic layer deposition (ALD) process, an electron-beam deposition process and/or the pulse laser deposition process. The second electrode 215 may be formed using doped polysilicon, a conductive material including nitrogen, metal or metal silicide. Other material(s)/process(es) may be used. For example, the second electrode 215 may be formed using titanium nitride, tungsten nitride, tantalum nitride, aluminum nitride, titanium aluminum nitride, tungsten, aluminum, titanium, tantalum, copper, cobalt silicide, tantalum silicide, etc.

Figure 2K:
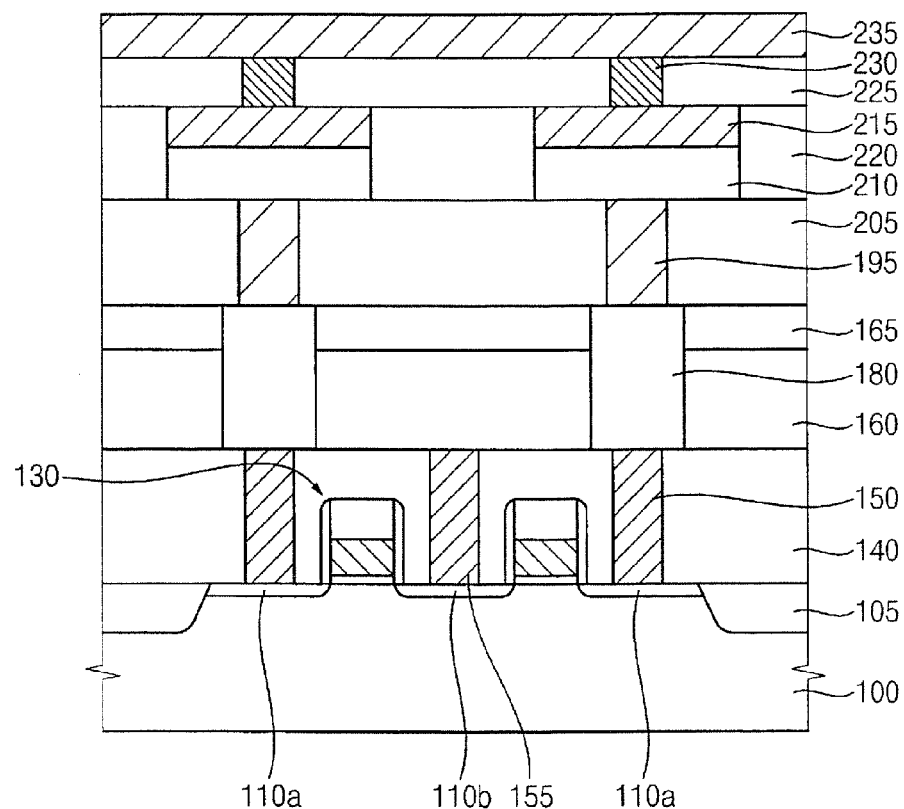

Referring to FIG. 2K, after a third insulating interlayer 220 covering the phase changeable material layer pattern 210 and the second electrode 215 is formed on the second insulating interlayer 205, a fourth insulating interlayer 225 is formed on the third insulating interlayer 220 and on the second electrode 215. The third insulating interlayer 220 and the fourth insulating interlayer 225 may be formed using an oxide such as USG, SOG, FOX, PSG, BPSG, TEOS, PE-TEOS, HDP-CVD oxide, etc. Other material(s)/process(es) may be used. In addition, the third insulating interlayer 220 and the fourth insulating interlayer 225 may be formed by the CMP process, the PECVD process or the HDP-CVD process.

After an upper contact hole exposing the second electrode 215 is formed by partially etching the fourth insulating interlayer 225, an upper pad 230 filling up the upper contact hole is formed on the exposed second electrode 215. The upper pad 130 may be formed using a metal and/or a metal nitride. For example, the upper pad 130 may be formed using tungsten, aluminum, titanium, tantalum, copper, titanium nitride, tungsten nitride, tantalum nitride, aluminum nitride, titanium aluminum nitride, etc. Other material(s)/process(es) may be used.

The phase changeable memory device may be manufactured on the substrate 100 by forming an upper line 235 on the upper pad 230 and on the fourth insulating interlayer 225. The upper line 235 may be electrically connected to the second electrode 215 through the upper pad 230.

In the above-mentioned embodiments of phase changeable memory devices, the first electrode 195 heats the phase changeable material layer pattern 210 to decrease viscosity of the phase changeable material layer pattern 210. Thus, a phase of the phase changeable material layer pattern 210 may be efficiently changed using the first electrode 195. In addition, the first electrode 195 may make ohmic contact with the phase changeable material layer pattern 210. For example, current flows to the phase changeable material layer pattern 210 through the first electrode 195 so that a portion of the phase changeable material layer pattern 210 may be changed into a crystal state or an amorphous state in accordance with differences in heating states of the phase changeable material layer pattern 210.

To achieve a desirable change in a phase of the phase changeable material layer pattern 210, it is desirable for the resistance of the first electrode 195 to be maintained uniformly. In addition, when achieving the uniformly maintained resistance of the phase changeable material layer pattern 210, changes in a cross-section and height of the first electrode 195 may play a significant role. For example, when changes in the cross-section and/or the height between the upper portion and the lower portion of the first electrode 195 are relatively large, it may be difficult to obtain a desirable phase change in the phase changeable material layer pattern 210. Thus, an electrical characteristic of the phase changeable memory device may be deteriorated.

In contrast, in some embodiments of the present invention, after the preliminary first electrode 190 is formed, sidewalls of the preliminary first electrode 190 are partially etched so that the first electrode 195 having the uniform cross-section and uniform height may be obtained. Accordingly, a contact between the first electrode 195 and the diode 180 may be efficiently maintained regardless of a subsequent polishing process. In addition, the current may be provided uniformly to the phase changeable material layer pattern 210 through the first electrode 195 having the uniform cross-section. Therefore, electrical characteristics of the phase changeable memory device may be improved.

FIGS. 3A to 3D are cross-sectional views illustrating methods of manufacturing variable resistance memory devices, such as phase changeable memory devices, and devices so manufactured, in accordance with other embodiments of the present invention.

The processes performed before forming the first electrode 195 that has the uniform cross-section on the second insulating layer 165 may be substantially the same as those illustrated in FIGS. 2A to 2G. Thus, any further explanation will be omitted in the interest of brevity.

Figure 3A:
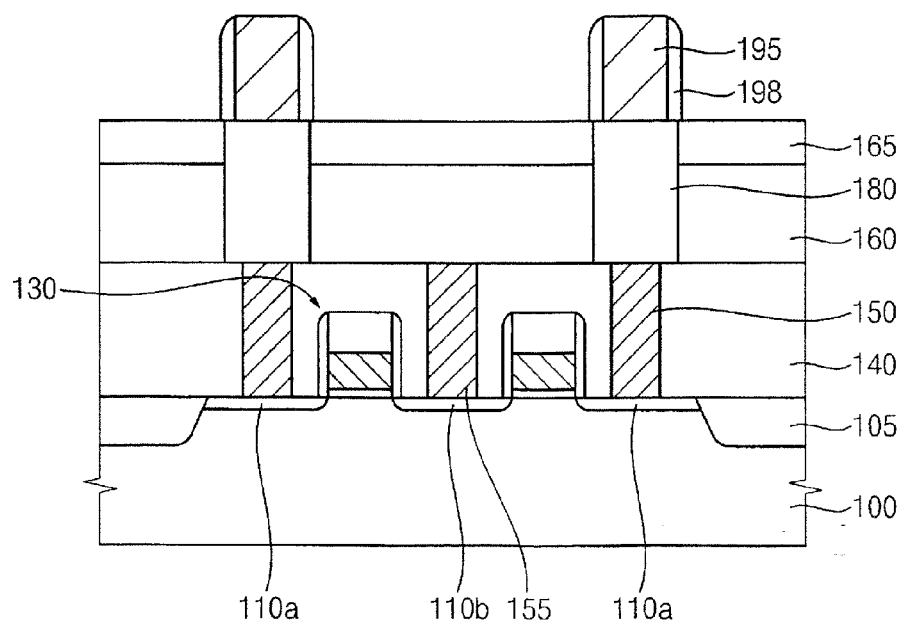
FIGS. 3A to 3D are cross-sectional views illustrating methods of manufacturing variable resistance memory devices, such as phase changeable memory devices, and devices so formed, in accordance with other embodiments of the present invention.

Referring to FIG. 3A, an additional insulating layer (not shown) having a uniform thickness is formed on the second insulating layer 165 to cover the first electrode 195. The additional insulating layer is then etched so that a spacer 198 may be formed on a sidewall of the first electrode 195. The spacer 198 may be formed using a material having an etching selectivity with respect to the first electrode 195. For example, when the first electrode 195 includes doped polysilicon, the spacer 198 may be formed using an oxide such as silicon oxide, nitride, silicon oxynitride. The nitride may be silicon nitride. The oxynitride may be silicon oxynitride or titanium oxynitride. Other material(s)/process(es) may be used. Here, the spacer 198 may be formed by anisotropically etching the additional insulating layer.

As illustrated in FIG. 3A, the first electrode 195 having a uniform cross-section along a height thereof is initially formed. The spacer 198 is then formed on the sidewalls of the first electrode 195. As a result, even though the spacer 198 is formed, the cross-section of the first electrode 195 may not decrease, in contrast with a conventional method. In addition, the spacer 198 formed on the sidewalls of the first electrode 195 may reduce or prevent the height of the first electrode 195 from decreasing in a subsequent CMP process.

Figure 3B:
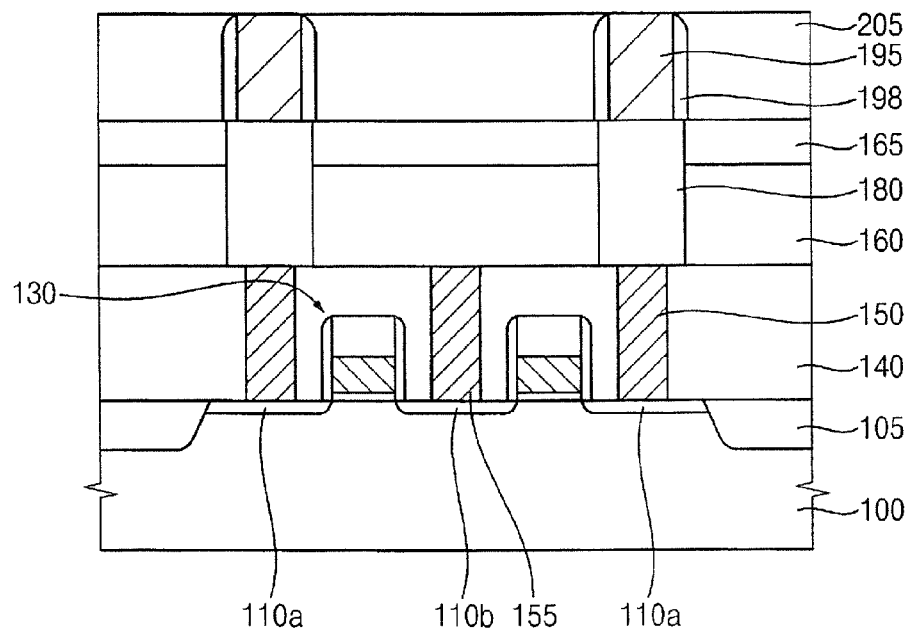

Referring to FIG. 3B, a preliminary second insulating interlayer is formed on the second insulating layer 165 to cover the first electrode 195 and the spacer 198. The preliminary second insulating interlayer may have a sufficient thickness so that the preliminary second insulating interlayer may fully cover the first electrode 195 and the spacer 198. The preliminary second insulating interlayer may be formed using the oxide such as USG, SOG, FOX, PSG, BPSG, TEOS, PE-TEOS, HDP-CVD oxide, etc. Other material(s)/process (es) may be used.

The preliminary second insulating interlayer is polished until the spacer 198 and the first electrode 195 are exposed so that the second insulating interlayer 205 covering the first electrode 195 and the spacer 198 may be formed on the second insulating layer 165. The second insulating interlayer 205 may have a relatively flat upper surface. The second insulating interlayer 205 may be formed by a CMP process using a slurry composition for polishing an oxide. While the CMP process is performed, the spacer 198 can protect the first electrode 195. As a result, the height of the first electrode 195 formed on the diode 180 may not easily decrease in the CMP process. Other material(s)/process(es) may be used.

Figure 3C:
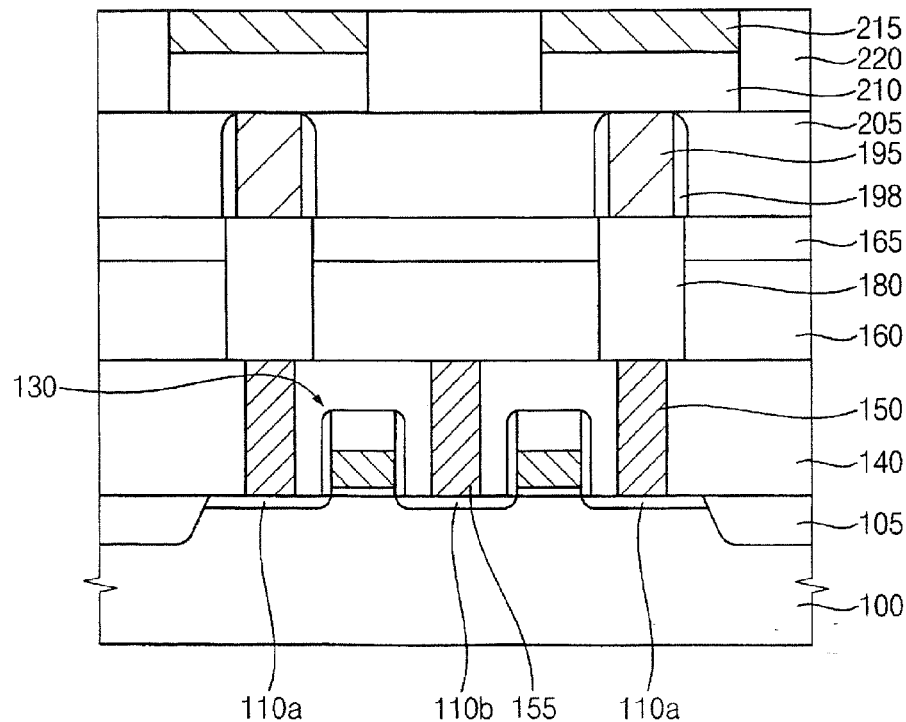

Referring to FIG. 3C, a phase changeable material layer and a second electrode layer are subsequently formed on the spacer 198, the first electrode 195 and on the second insulating interlayer 205. The second electrode layer and the phase changeable material layer are then patterned so that a second electrode 215 and a phase changeable material layer pattern 210 may be formed on the first electrode 195. The phase changeable material layer may be formed by the sputtering process, the CVD process, the pulse laser disposition process, the atomic layer deposition (ALD) process, etc. The second electrode layer may be formed by depositing doped polysilicon, a conductive material including nitrogen, metal or metal silicide by the sputtering process, the CVD process, the pulse laser deposition process or the atomic layer deposition (ALD) process. Other material(s)/process(es) may be used.

A third insulating interlayer 220 covering the second electrode 215 and the phase changeable material layer pattern 210 is formed on the second insulating interlayer 205. The third insulating interlayer 220 may be formed using an oxide such as USG, SOG, FOX, PSG, BPSG, TEOS, PE-TEOS, HDP-CVD oxide, etc. by the CVD process, the PECVD process or HDP-CVD process. Other material(s)/process(es) may be used.

Figure 3D:
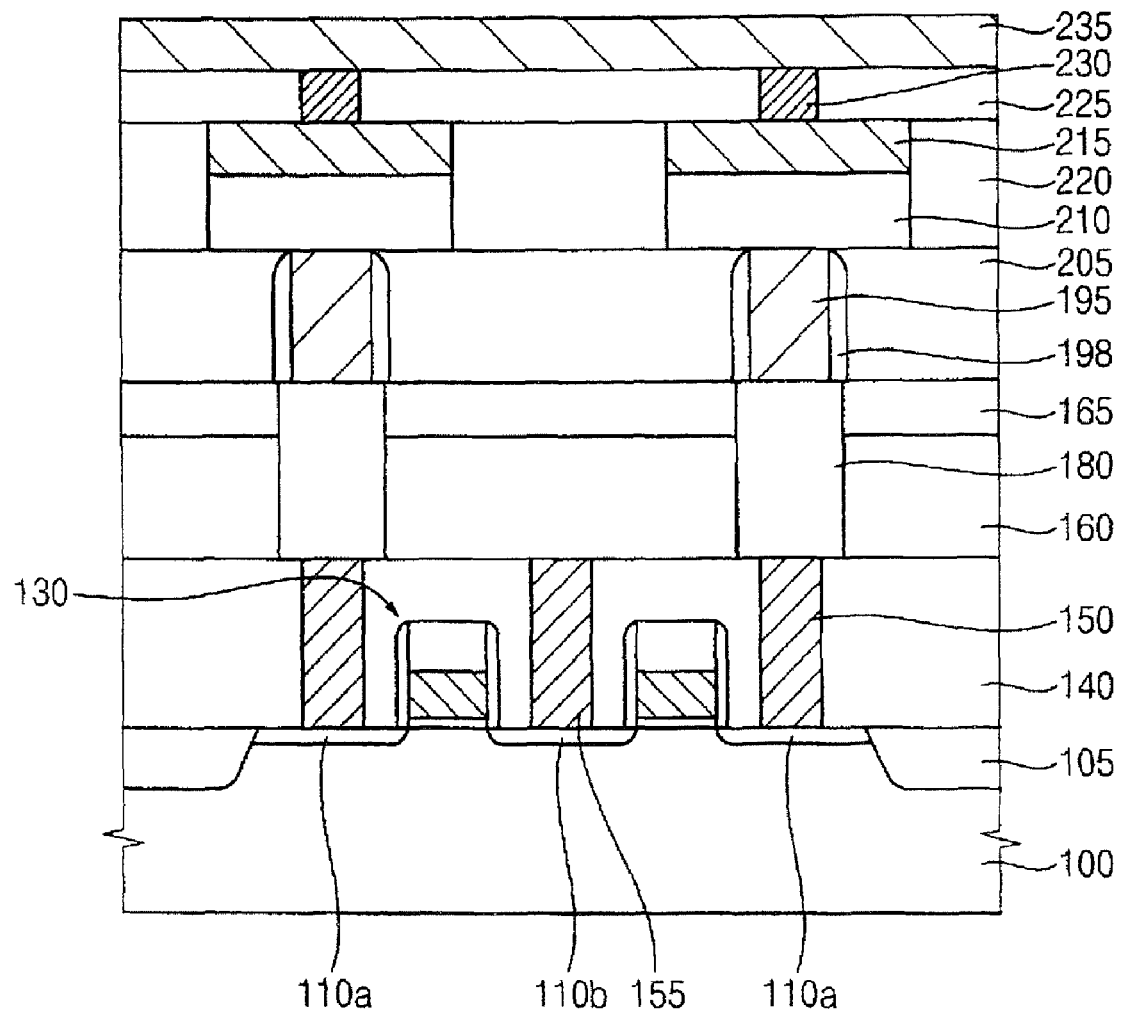

Referring to FIG. 3D, after a fourth insulating layer 225 is formed on the third insulating interlayer 220 and the second electrode 215. Thereafter, the fourth insulating layer 225 may be partially etched so that an upper contact hole exposing the second electrode 215 may be formed. The fourth insulating interlayer 225 may be formed using an oxide such as USG, SOG, FOX, PSG, BPSG, TEOS, PE-TEOS, HDP-CVD oxide, etc. by the CVD process, the PECVD process or the HDP-CVD process. Other material(s)/process(es) may be used.

An upper pad 230 is formed on the exposed second electrode 215 to fill up the upper contact hole. An upper line 235 is then formed on the upper pad 230 and the fourth insulating interlayer 225 so that a phase changeable memory device may be manufactured on the substrate 100. The upper pad 230 may be formed using a metal and a metal nitride. The metal may be tungsten, aluminum, titanium, tantalum, copper, etc. The metal nitride may be titanium nitride, tungsten nitride, tantalum nitride, aluminum nitride, titanium aluminum nitride, etc. Other material(s)/process(es) may be used. The upper line 235 may be formed using the metal or the metal nitride. The upper line 235 may be electrically connected to the second electrode 215 through the upper contact 230.

In the above-mentioned phase changeable memory devices, the spacer 198 is additionally formed on the first electrode 195 which includes the doped polysilicon and has a relatively uniform cross-section and height. Thus, the first electrode 195 and the diode 180 may sufficiently make contact with each other regardless of the subsequent polishing process for polishing the second insulating interlayer 205. Further, current may be uniformly provided to the phase changeable material layer pattern 210 through the first electrode 195 having a relatively uniform cross-section so that electrical characteristics of the phase changeable memory device may be improved.

According to various embodiments of the present invention, after a preliminary first electrode including polysilicon is formed, both sidewalls of the preliminary first electrode are partially etched. Thus, a first electrode having a relatively uniform cross-section and height may be formed. In addition, a spacer may be additionally formed on sidewalls of the first electrode having a relatively uniform size. Therefore, the first electrode and a diode may sufficiently make contact with each other regardless of a subsequent polishing process. In addition, current may be uniformly provided to a phase changeable material layer pattern through the first electrode having the relatively uniform size so that electrical characteristics of a phase changeable memory device may be improved.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. The invention is defined by the following claims, with equivalents of the claims to be included therein.

What is claimed is:

1. A method of manufacturing a phase changeable memory device, the method comprising:
   forming a contact region on a substrate;
   forming at least one insulating layer on the substrate, the insulating layer having a diode electrically connected to the contact region;
   forming a preliminary first electrode on the diode;

forming a first electrode on the diode by partially etching the preliminary first electrode;
forming an insulating interlayer covering the first electrode on the insulating layer;
forming a phase changeable material layer pattern on the first electrode and the insulating interlayer; and
forming a second electrode on the phase changeable material layer pattern; wherein forming at least one insulating layer comprises:
forming a first insulating layer on the substrate;
forming a second insulating layer on the first insulating layer;
forming a third insulating layer on the second insulating layer;
forming an opening by partially etching the third insulating layer, the second insulating layer and the first insulating layer; and
forming the diode partially filling the opening, the diode being electrically connected to the contact region.

2. The method of claim 1, wherein forming the insulating interlayer comprises:
forming a preliminary insulating interlayer covering the first electrode on the insulating layer; and
forming the insulating interlayer covering the first electrode by performing a chemical mechanical polishing process on the preliminary insulating interlayer with a slurry composition including a cerium oxide.

3. A method of manufacturing a phase changeable memory device, the method comprising:
forming a contact region on a substrate;
forming at least one insulating layer on the substrate, the insulating layer having a diode electrically connected to the contact region;
forming a preliminary first electrode on the diode;
forming a first electrode on the diode by partially etching the preliminary first electrode;
forming an insulating interlayer covering the first electrode on the insulating layer;
forming a phase changeable material layer pattern on the first electrode and the insulating interlayer; and
forming a second electrode on the phase changeable material layer pattern;
the method further comprising forming a spacer on sidewalls of the first electrode.

4. The method of claim 3, wherein the spacer is formed using a material having an etching selectivity with respect to the first electrode.

5. A method of manufacturing a variable resistance memory device comprising:
forming an insulating layer on a substrate;
forming an electrode that protrudes away from the insulating layer;
isotropically etching the electrode that protrudes away from the insulating layer to uniformly narrow the electrode that protrudes away from the insulating layer; and
forming a variable resistance layer on the electrode that has been uniformly narrowed;
wherein isotropically etching the electrode that protrudes away from the insulating layer is followed by forming a spacer on a sidewall of the electrode that has been uniformly narrowed.

6. The method of claim 5, wherein forming an electrode that protrudes away from the insulating layer is preceded by forming a diode in the insulating layer and wherein forming an electrode that protrudes away from the insulating layer comprises forming an electrode that protrudes away from the insulating layer on the diode.

7. The method of claim 6, wherein isotropically etching the electrode that protrudes away from the insulating layer comprises isotropically etching the electrode that protrudes away from the insulating layer to uniformly narrow the electrode that protrudes away from the insulating layer to be narrower than the diode.

8. The method of claim 6, wherein the insulating layer is a first insulating layer and wherein forming a diode in the first insulating layer is preceded by:
forming a second insulating layer on the substrate; and
forming a contact in the second insulating layer;
wherein forming a diode comprises forming the diode in the first insulating layer on the contact.

9. The method of claim 5, wherein the insulating layer is a first insulating layer and wherein forming an electrode that protrudes away from the insulating layer comprises:
forming a second insulating layer on the first insulating layer;
etching the second insulating layer to form a via therein;
forming a conductive layer in the via and on the second insulating layer outside the via;
removing the conductive layer from the second insulating layer outside the via so that at least some of the conductive layer remains in the via; and
removing at least some of the second insulating layer.

* * * * *